United States Patent [19]
Sorel et al.

[11] Patent Number: 6,131,895
[45] Date of Patent: Oct. 17, 2000

[54] HOLDING DEVICE FOR HOLDING A PRINTED CIRCUIT PANEL

[75] Inventors: Alain Sorel, Les Baux Sainte Croix; Xavier Germond, Evreux, both of France

[73] Assignee: Automa-Tech, Val de Reuil, France

[21] Appl. No.: 09/185,845

[22] Filed: Nov. 4, 1998

[30]    Foreign Application Priority Data

Nov. 7, 1997 [FR] France ................................. 97 14022

[51] Int. Cl.⁷ .................................................. B23Q 1/00
[52] U.S. Cl. .......................................... 269/54.5; 269/903
[58] Field of Search .............................. 269/54.5, 47, 52, 269/903, 8

[56]             References Cited

U.S. PATENT DOCUMENTS

| | | | |
|---|---|---|---|
| 4,700,488 | 10/1987 | Curti | 269/903 |
| 4,859,498 | 8/1989 | Yamaguchi | 269/903 |
| 4,951,240 | 8/1990 | Fukino . | |
| 5,296,082 | 3/1994 | Kubo | 269/903 |
| 5,738,165 | 4/1998 | Imai | 269/903 |
| 5,932,065 | 10/1987 | Mitchell | 269/903 |

FOREIGN PATENT DOCUMENTS

| | | |
|---|---|---|
| 0 404 577 | 12/1990 | European Pat. Off. . |
| 41 08 846 | 9/1992 | Germany . |
| 43 39 092 | 5/1995 | Germany . |

*Primary Examiner*—David A. Scherbel
*Assistant Examiner*—Daniel G. Shanley
*Attorney, Agent, or Firm*—O'Melveny & Myers LLP

[57]             ABSTRACT

A device is provided for holding a printed circuit panel having two substantially parallel margins. The device has a frame and employs two grasping jaws to hold the first and second margins of the panel, respectively. An actuator coupled to one of the grasping jaws provides a force that tends to move away one grasping jaw with respect to the other grasping jaw and thereby provides a tension to keep the printed circuit panel plane. Since the printed circuit panel is grapsed by and traction is exerted on the two parallel margins, the panel is held with highly accurate planeness regardless of its dimensions and of its thickness. In This manner, the device for holding a printed circuit panel may accommodate panels with a wide variety of sizes.

16 Claims, 3 Drawing Sheets

HOLDING DEVICE FOR HOLDING A PRINTED CIRCUIT PANEL

FIELD OF THE INVENTION

The present invention relates to a holding device for holding printed circuit panels.

The term "holding device" is used to mean a system making it possible to guarantee that a printed circuit panel is held in a strictly planar configuration regardless of its thickness or its dimensions.

BACKGROUND OF THE INVENTION

When making printed circuits, the starting material is an insulating support plate coated in copper on its front and back surfaces, and of thickness and dimensions that can vary from one circuit to another.

To perform various operations on the insulating support for the purpose of making a printed circuit, it is usually necessary for the printed circuit panel to be accurately plane while the operations are being performed. For example, this is necessary when performing punching operations on the panel to ensure that its holes are accurately located. It is also necessary when a conductor or other material is to be deposited on the insulating support, e.g. in a photoetching operation, in order to guarantee that the layer deposited by photoetching has exactly the right shape.

Documents DE 43 39092, U.S. Pat. No. 4,700,488, and DE 41 08846 describe machines for holding printed circuit panels that are based on engaging parallel margins of the panel.

However, in those machines, the means for taking hold of the margins of the panel are insufficient for guaranteeing that the panel is kept planar without any warping, particularly if the panel is of large dimensions and is also heavy.

OBJECTS AND SUMMARY OF THE INVENTION

An object of the present invention is to provide a device for holding printed circuit panels that is capable of adapting to panels of various dimensions while still ensuring very good planeness regardless of the thickness and the dimensions of the sides of said panel.

According to the invention, this object is achieved by a holding device for holding a printed circuit panel having two substantially parallel margins, the device comprising:

a frame;

first grasping means for grasping a first margin of said panel, each grasping means having a first part forming a plane clamping surface and a second part disposed facing the plane clamping surface, said second part having a plurality of rods mounted to slide in a direction orthogonal to said clamping surface and terminated in respective pointed ends, and means for displacing said rods relative to said second part to move said pointed ends towards said plane clamping surface;

second grasping means for grasping the second margin of said panel; and means for applying a separating force between the first and second grasping means, thereby keeping said panel plane.

Since the panel is grasped by two parallel margins and since traction is exerted on said margins, the panel is held with highly accurate planeness regardless of its dimensions and of its thickness.

The grasping means comprise rods terminating in pointed shapes disposed facing a clamping surface. The two faces of the panel close to its margin are thus held by the pressure exerted by the points of the rods against one of the faces of the panel while the other face is held in position by the clamping surface which also constitutes a bearing surface for the bottom face of the margin of the panel.

In an improved embodiment, each panel-grasping means has two clamping surfaces, one of said surfaces being fitted with rods having pointed ends.

It will be understood that this ensures that sufficient holding force is obtained because of the presence of the points, without it being necessary to exert a large amount of pressure on the two clamping surfaces. It will also be understood that in embodiments using two clamping surfaces of sufficient size, any warping of the printed circuit panel is subjected to highly effective mechanical rectification, which rectification is additional to that which results from the traction exerted between the two means for grasping the opposite margins of the panel.

BRIEF DESCRIPTION OF THE DRAWINGS

Other characteristics and advantages of the invention appear better on reading the following description of various embodiments of the invention given as non-limiting examples. The description refers to the accompanying figures, in which.

MORE DETAILED DESCRIPTION

Figure 1:
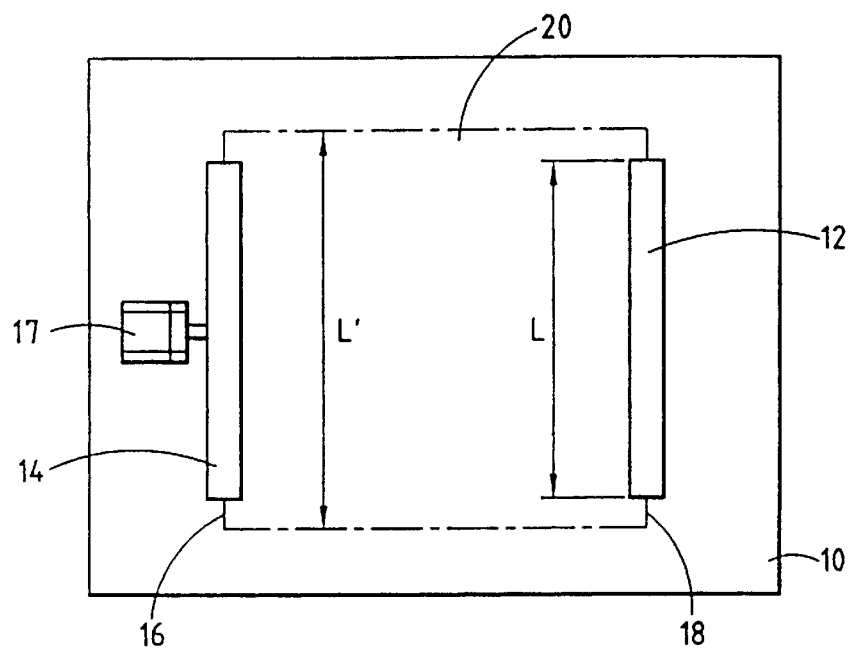
FIG. 1 is a highly diagrammatic overall view of the holding device.

With reference initially to FIG. 1, the principle of the holding device for holding a printed circuit panel is described. In this figure, there can be seen the frame 10 of the device which is, in fact, constituted by the frame of the machine on which the device is mounted.

The holding device essentially comprises two grasping means 12 and 14 referred to below as grasping jaws. These jaws 12 and 14 serve to grasp the two parallel margins 16 and 18 of the printed circuit panel 20 whose planeness is to be guaranteed. By way of example, the jaw 12 is fixed relative to the frame while the jaw 14 is capable of being moved, e.g. by means of an actuator 17.

It will thus be understood that tension can be exerted on the panel 20, thereby making it possible to ensure that it is held in a plane configuration. It should naturally be emphasized that the length L of each jaw 12 or 14 should be substantially of the same order as the length L' of the largest panel so as to ensure that it is held in a plane configuration over its entire length.

Figure 2:
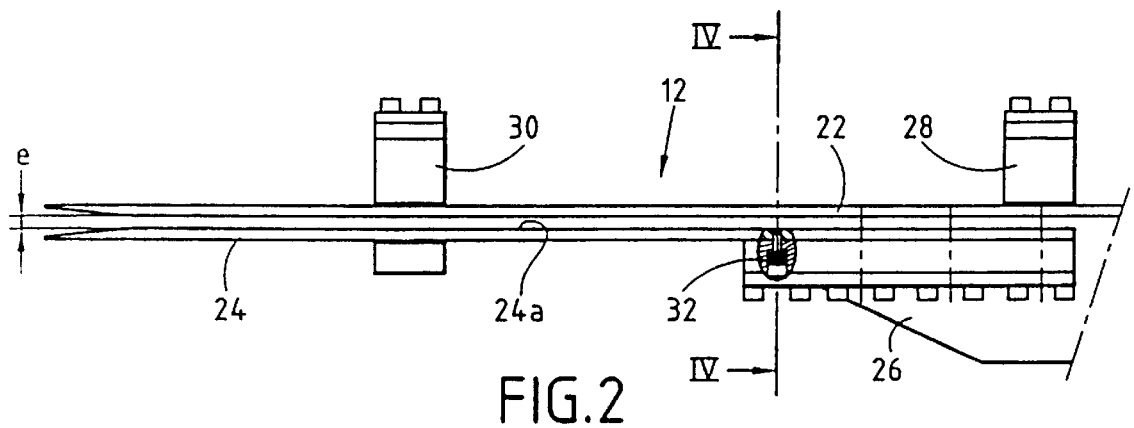
FIG. 2 is a side view of means for grasping the margin of the panel.
Figure 3:
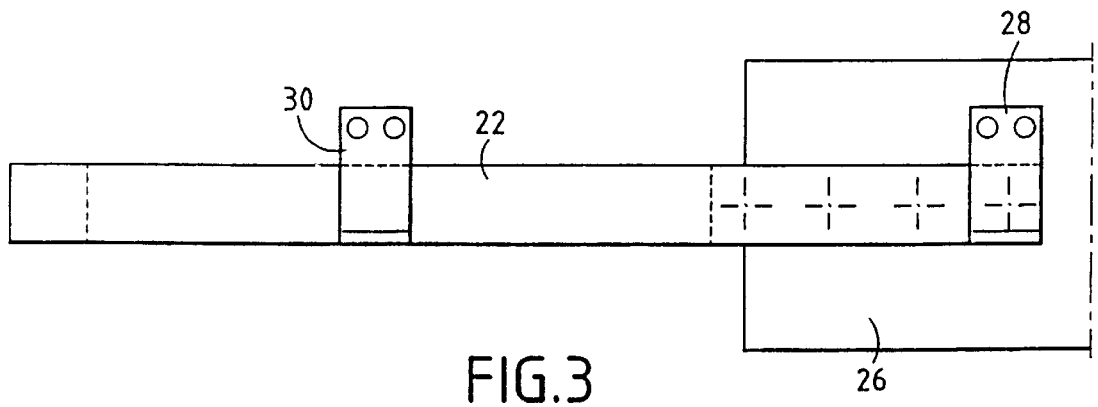
FIG. 3 is a plan view of the grasping means shown in FIG. 2.

With reference to FIGS. 2 and 3, there follows a description of the principle on which each of the jaws for grasping a margin of the panel is made. By way of example, the jaw 12 is described. This jaw is essentially constituted by two strips 22 and 24 disposed facing each other and constrained to remain parallel to each other. The bottom strip 24 is secured to the frame 10, e.g. by means of a plate 26. The top strip 22 is movable relative to the strip 24 so that the top strip can occupy a rest position in which the spacing e between the two strips is greater than the maximum thickness of a printed circuit panel plus any warping thereof, and a second or clamping position in which the faces of the strips 22 and 24 apply pressure against the two faces of the printed circuit panel 20. For example, the top strip 22 is secured to two advancing assemblies 28 and 30 which are described in greater detail below. In this embodiment, a margin of the panel is grasped not only by the pressure exerted by the strips 22 and 24 when they are moved towards each other, but also by rods such as 32 which are movably mounted and distributed over the length of the strip 24 in such a manner that in the extended position, the rods 32 present respective pointed ends projecting from the top face 24a of the bottom strip 24. The displacement assembly 28 or 30 is described in greater detail below.

Figure 4:
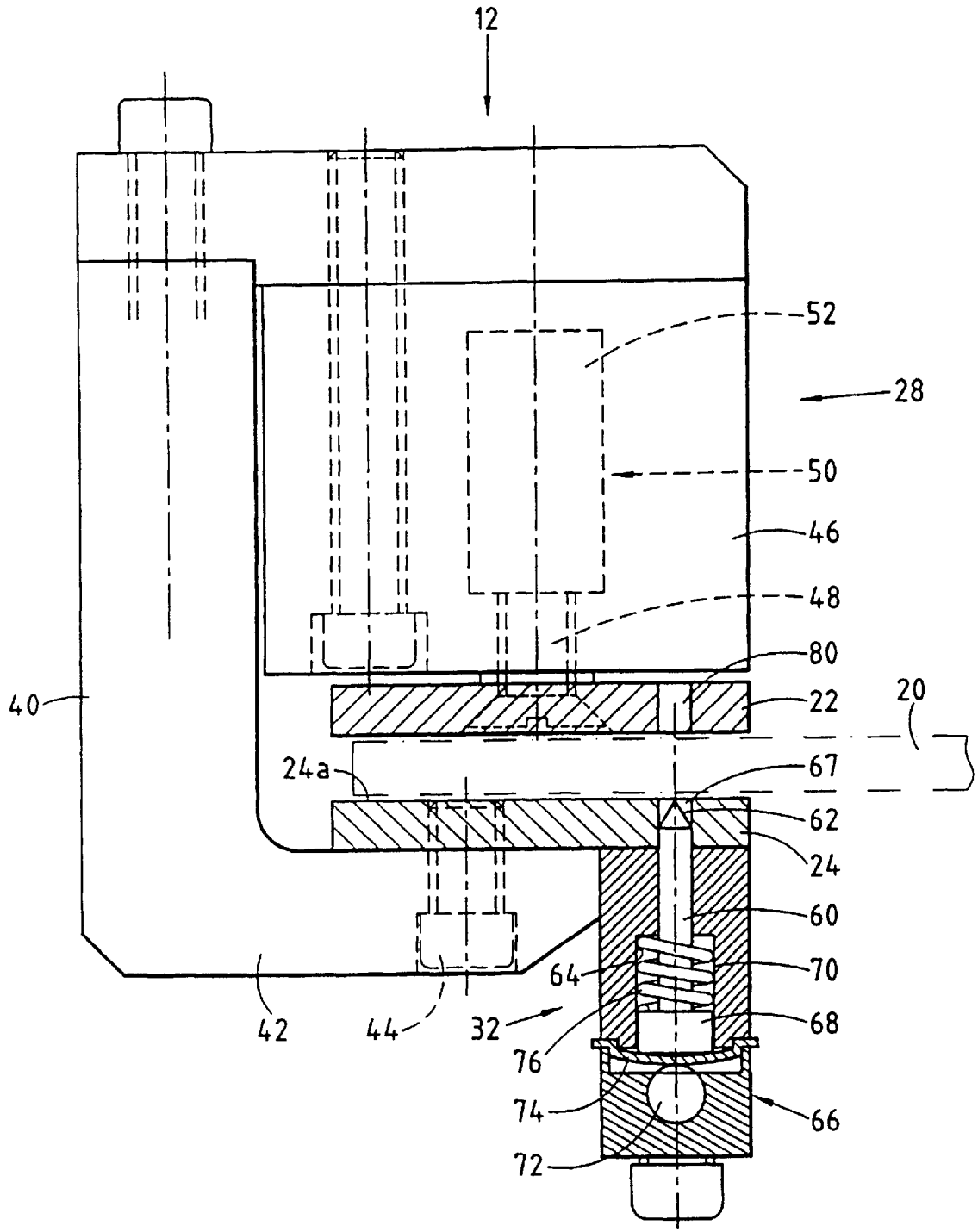
FIG. 4 is a detailed cross-section of an embodiment of a clamping element.

With reference to FIG. 4, a preferred embodiment of the advancing assembly 28 is described in greater detail. This assembly comprises a support 40 having a bottom portion 42 on which the bottom strip 24 is fixed, e.g. by means of a screw 44. The support 40 also has a top portion 46 on which the top strip 22 is movably mounted. The strip 22 is secured to the rod 48 of an actuator 50 whose body 52 is secured to the portion 46. The rod 48 constrains the strip 22 to remain parallel with the strip 24. It will be understood that by operating the actuator 50, the strip 22 is moved towards the strip 24, thereby pinching the margin of the printed circuit panel 20. In some cases, it can be advantageous for the two strips 22 and 24 to be of a width k to ensure that when the two strips clamp onto the margin of the panel, they impose a direction thereon.

FIG. 4 also shows a retractable rod 32 having a pointed end which also serves to hold the margin of the printed circuit panel.

The rod proper 60 having a pointed end 62 is slidably mounted in a housing 64 formed in a body 66 secured to the bottom face of the bottom strip 24. The bodies 66 are distributed along the length of the strip 24. The housing 64 is extended by a hole 67 formed through the strip 24 to allow the point 62 of the rod to project from the top face of the strip 24. At its other end, the rod 60 has an actuator head 68 disposed in an enlarged portion 70 of the housing 64. The body 66 also defines a control chamber 72 which is closed by a deformable membrane 74. By admitting a fluid under pressure into the chamber 72, the membrane 74 is caused to move, thereby moving the rod 60 whose pointed end projects from the strip 24. A return spring 76 urges the rod 60 towards its retracted position. The top strip 22 preferably has a small recess 80 facing the rod 60.

It will be understood that in this embodiment, the margin of a printed circuit panel is grasped by pinching said margin between the strips 22 and 24 and by causing the point of the rod 60 to penetrate into the margin of the bottom face of the panel.

A single advancing assembly can be provided with a plurality of rods 60 disposed in parallel along the width of the strip 24, these rods being controlled by a common chamber 72.

Naturally, it would not go beyond the invention for the advancing assembly to have only one strip plus the rods 60, with clamping being obtained by co-operation between the rods and the clamping surface. Under such circumstances, it would be preferable for the rods 60 to be mounted in the top portion 22 of the grasping means, with the bottom strip 24 then also constituting a bearing surface for the margin of the bottom face of the panel.

It will be understood that the strips 22 and 24 of the jaws 12 and 14 constitute two parallel guide slots for the opposite margins of the printed circuit panel. To bring the panel into the working position, it is therefore necessary to provide a conveyor which enables the panel to be moved relative to the jaws 12 and 14 to bring it into the desired position after the ends of the panel margins have been engaged in the guide-forming slots.

Figure 5:
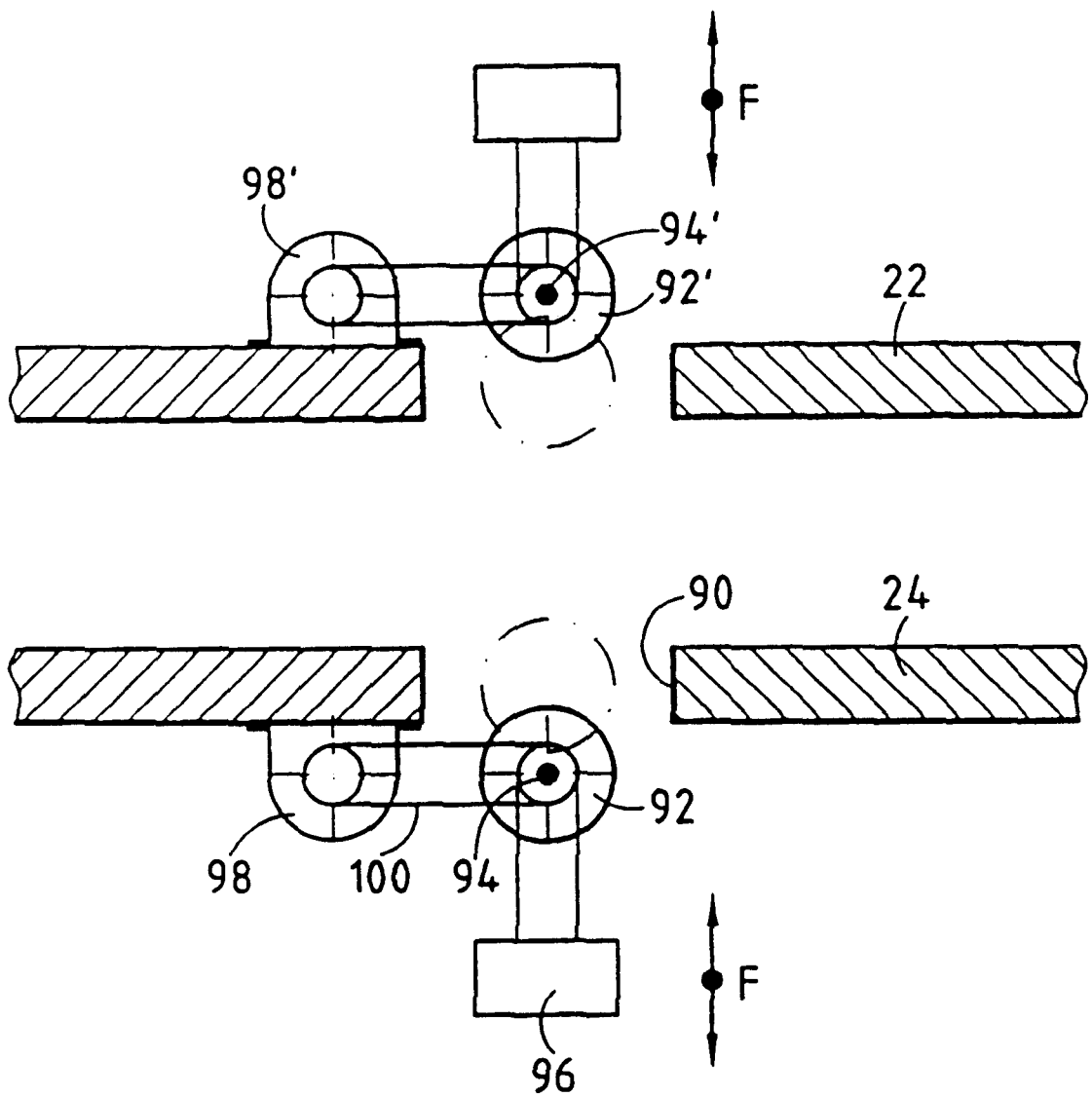
FIG. 5 is a fragmentary view showing a variant embodiment in which the holding means are fitted with means for displacing the panel.

FIG. 5 shows an embodiment of the holding device which also enables a panel to be moved along the slots formed by the strips 22 and 24.

The strip 24 has holes uniformly distributed along its length. In register with each hole 90 there is mounted a wheel 92 whose axis 94 is carried by a support 96 that can be moved in translation. In the position shown in FIG. 5, the wheels 92 are retracted away from the active face of the strip 24. By moving the support in the direction of arrow F it is possible to bring the wheel 92 into an active position where it projects into the active face of the strip 24. Each wheel 92 is connected to a micromotor 98 via a transmission system 100. Each wheel can therefore be rotated about its axis 94.

The strip 22 is also fitted with wheels 92' on axes 94' that can be moved in such a manner as to enable the wheels 92' to occupy either a retracted position or an active position in which they project from the active face of the strip 22. The wheels 92' can be mounted so as to rotate freely, or they can be rotated by micromotors 98'.

It will be understood that when the leading ends of the panel margins are engaged in the slots formed by the two strips (the strips then naturally being spaced apart), the wheels are moved so that they project into the slot and they are caused to rotate so as to make the panel move forwards.

Any means other than wheels enabling the panel to be driven between the two strips could also be envisaged, e.g.: belts, . . . .

The holding device of the invention can advantageously be used in a machine for punching printed circuit panels or in a machine for exposing them to radiation through one or more artworks for the purpose of performing printing operations on a printed circuit panel.

What is claimed is:

1. A holding device for holding a printed circuit panel having two substantially parallel margins, the device comprising:

a frame;

first and second grasping means for respectively grasping said first and second margins of said panel, each grasping means having a first part forming a plane clamping surface and a second part disposed facing the plane clamping surface, said second part having a plurality of rods mounted to slide in a direction orthogonal to said clamping surface and terminated in respective pointed ends, and means for displacing said rods relative to said second part to move said pointed ends toward said plane clamping surface; and means for applying a force between said first and second grasping means tending to move away one grasping means with respect to the other grasping means whereby a tension is applied to the panel keeping said panel plane.

2. A holding device according to claim 1, wherein said second part of each grasping means further has an additional clamping surface disposed facing said clamping surface, and wherein each grasping means includes means for moving said clamping surface relative to said additional clamping surface.

3. A holding device according to claim 1, wherein each rod has a second end opposite to said pointed end, and wherein the means for displacing said rods comprise a deformable membrane disposed in register with the second ends of the rods, a leakproof chamber closed by said membrane, and means for admitting into said chamber a fluid under pressure so that deformation of said membrane causes said rods to move simultaneously.

4. A holding device according to claim 1, wherein the means for separating the two grasping means comprise means for preventing the first grasping means from moving relative to the frame, and means for exerting traction on the second grasping means relative to said frame so as to cause the second grasping means to become separated relative to the first grasping means.

5. A holding device according to claim 2, wherein, at rest, said clamping surfaces of each grasping assembly define between them a slot suitable for receiving a margin of a printed circuit panel.

6. A holding device according to claim 5, wherein at least one of the parts defining a clamping surface has drive wheels for driving the margin of a printed circuit panel, means for moving the axes of said wheels relative to said part between a first position in which said wheels project from said clamping surface and a second position in which said wheels are fully retracted into said part, and means for driving each wheel in rotation about its axis, whereby said printed circuit panel is driven in translation along said slots relative to said holding device.

7. A holding device according to claim 2, wherein each rod has a second end opposite to said pointed end, and wherein the means for displacing said rods comprise a deformable membrane disposed in register with the second ends of the rods, a leakproof chamber closed by said membrane, and means for admitting into said chamber a fluid under pressure so that deformation of said membrane causes said rods to move simultaneously.

8. The use of the holding device according to claim 1, in making a machine for punching printed circuit panels.

9. The use of the holding device according to claim 1, in making a machine for exposing a printed circuit panel to light.

10. An apparatus for holding a printed circuit panel having two substantially parallel margins, the apparatus comprising:

a frame;

first and second grasping jaws coupled to the frame and arranged to grasp said first and second margins of said panel respectively, each grasping jaw having a first part defining a plane clamping surface and a second part disposed facing the plane clamping surface, said second part having a plurality of rods adapted to slide in a direction orthogonal to said clamping surface and terminated in respective pointed ends;

an actuator assembly coupled to said plurality of rods to thereby move said pointed ends toward said plane clamping surface;

an actuator coupled to said first grasping jaw, said actuator providing a force that tends to move away said first grasping jaw with respect to the second grasping jaw whereby a tension is applied to the panel keeping said panel plane; and at least one advancing assembly coupled to each of said grasping jaws, said advancing assembly having a top portion on which the first part defining a plane clamping surface is fixed and having a bottom portion on which the second part disposed facing the plane clamping surface is fixed.

11. The apparatus according to claim 10, wherein said second part of each grasping jaw further has an additional clamping surface disposed facing said clamping surface, and wherein the advancing assembly includes an actuator to move said clamping surface relative to said additional clamping surface.

12. The apparatus according to claim 10, wherein each rod has a second end opposite to said pointed end, and wherein the actuator assembly coupled to said rods comprises a set of deformable membranes disposed in register with the second ends of the rods, a leakproof chamber closed by said membrane, and a body to admit into said chamber a fluid under pressure so that deformation of said membrane causes said rods to move simultaneously.

13. The apparatus according to claim 10, wherein the actuator prevents the first grasping jaw from moving relative to the frame, and exerts traction on the second grasping jaw relative to said frame so as to cause the second grasping jaw to become separated relative to the first grasping jaw.

14. The apparatus according to claim 11, wherein, at rest, said clamping surfaces of each grasping jaw define between them a slot suitable for receiving a margin of a printed circuit panel.

15. The apparatus according to claim 14, wherein at least one part defining a clamping surface has drive wheels, each wheel having a respective axis, to drive the margin of the printed circuit panel, a support to move the axes of said wheels relative to said part between a first position in which said wheels project from said clamping surface and a second position in which said wheels are fully retracted into said part, and a micromotor coupled to each wheel in rotation about its axis, whereby said printed circuit panel is driven in translation along said slots relative to said holding device.

16. The apparatus according to claim 11, wherein each rod has a second end opposite to said pointed end, and wherein the actuator assembly coupled to said rods comprises a deformable membrane disposed in register with the second ends of the rods, a leakproof chamber closed by said membrane, and a body to admit into said chamber a fluid under pressure so that deformation of said membrane causes said rods to move simultaneously.

* * * * *